(12) United States Patent
Lee et al.

(10) Patent No.: US 7,019,327 B2
(45) Date of Patent: Mar. 28, 2006

(54) ORGANIC SEMICONDUCTOR POLYMER AND ORGANIC THIN FILM TRANSISTOR USING THE SAME

(75) Inventors: Bang Lin Lee, Gyeonggi-do (KR); Eun Jeong Jeong, Daejeon-shi (KR); Jung Han Shin, Gyeonggi-do (KR); Bon Won Koo, Gyeonggi-do (KR); In Nam Kang, Gyeonggi-do (KR)

(73) Assignee: Samsung Electronics Co., Ltd., Suwon-shi (KR)

( * ) Notice: Subject to any disclaimer, the term of this patent is extended or adjusted under 35 U.S.C. 154(b) by 12 days.

(21) Appl. No.: 10/732,243

(22) Filed: Dec. 11, 2003

(65) Prior Publication Data

US 2004/0124410 A1 Jul. 1, 2004

(30) Foreign Application Priority Data

Dec. 26, 2002 (KR) ...................... 10-2002-0084268

(51) Int. Cl.
*H01L 35/24* (2006.01)

(52) U.S. Cl. .......................................... 257/40; 438/99
(58) Field of Classification Search .................. 438/99; 257/40
See application file for complete search history.

(56) References Cited

U.S. PATENT DOCUMENTS

| | | | |
|---|---|---|---|
| 5,233,017 A * | 8/1993 | Dotrong et al. | ............. 528/332 |
| 5,294,820 A * | 3/1994 | Gemma et al. | ............. 257/324 |
| 5,625,199 A | 4/1997 | Baumbach et al. | |
| 6,316,098 B1 * | 11/2001 | Yitzchaik et al. | ........... 428/339 |
| 2003/0047729 A1 * | 3/2003 | Hirai et al. | ................... 257/40 |
| 2003/0085381 A1 * | 5/2003 | Worrall et al. | ......... 252/299.61 |

* cited by examiner

*Primary Examiner*—Trung Dang
(74) *Attorney, Agent, or Firm*—Buchanan Ingersoll PC (57) ABSTRACT

An organic semiconductor polymer for a thin film transistor, the polymer comprising a unit having n-type semiconductor properties and a unit having p-type semiconductor properties in the polymer backbone, and an organic thin film transistor using the same.

7 Claims, 4 Drawing Sheets

ORGANIC SEMICONDUCTOR POLYMER AND ORGANIC THIN FILM TRANSISTOR USING THE SAME

BACKGROUND OF THE INVENTION

This non-provisional application claims priority under 35 U.S.C. § 119(a) from Korean Patent Application No. 2002-84268 filed on Dec. 26, 2002, which is herein incorporated by reference.

1. Field of the Invention

The present invention relates to a novel organic semiconductor polymer and an organic transistor using the same, and more particularly to a composite-structured polythienylthiazole derivative in which thiazole rings having a high electron affinity, i.e. n-type semiconductor properties, are incorporated with thiophene units having p-type semiconductor properties, thereby exhibiting both p-type and n-type semiconductor properties.

2. Description of the Related Art

Recently, the use of low molecules, e.g., pentacene, as organic semiconductor materials has been actively researched. On the other hand, special attention has been paid to high molecules focusing on polythiophenes. The high molecules are attractive due to their low charge mobility and processability, compared to the low molecules. In addition, since the high molecule organic semiconductor materials can be applied in the form of solutions, unlike the low molecules, they can be formed into thin films by screen-printing, ink-jet and roll-printing techniques. Such high molecule organic semiconductor materials are useful in fabricating large area transistors on plastic films at low cost.

Cambridge Univ., Seiko Epson Corp., Philips Corp., etc. have already fabricated test products of high molecule organic thin film transistors employing a polythiophene-based material, e.g., P3HT (Poly(3-hexylthiophene) or F8T2 (a copolymer consisting of dioctylfluorene and bithiophene (ratio of 8:2)). These organic thin film transistors (hereinafter, referred to as "OTFT") have a low charge mobility of around 0.02 cm$^2$/Vs, which does not come up with pentacene as noted above, but do not require a high working frequency and can be fabricated into thin film transistors at low cost. For commercialization of OTFTs, important parameters, such as an acceptable on/off current ratio, as well as high charge mobility, must be satisfied. Specially, to improve the on/off current ratio, the off-state leakage current must be reduced to the lowest possible extent. Many attempts have been made to improve these properties in various ways. Research teams from Lucent Technologies Inc. reported improved results in parameters of OTFT devices by using a combination of an n-type inorganic semiconductor material and a p-type organic semiconductor material as an active layer (U.S. Pat. No. 5,625,199). However, there is no merit in fabrication process when compared to the conventional silicon-based TFT processes and this is not suitable for mass-production of OTFT devices. As such, high molecular weight OTFTs that satisfy the requirements of high charge mobility and low current loss at off-state, have not hitherto been reported.

SUMMARY OF THE INVENTION

A feature of the present invention is to provide an organic semiconductor polymer in which a unit having n-type semiconductor properties is incorporated with a unit having p-type semiconductor properties to impart n-type electrical properties to the polymer.

Another feature of the present invention is to provide a polythienylthiazole derivative in which thiazole rings having n-type semiconductor properties are incorporated with thiophene units having p-type semiconductor properties to impart n-type electrical properties to the polymer.

Still another feature of the present invention is to provide a method for preparing the above polythienylthiazole derivative.

Still another feature of the present invention is to provide an organic thin film transistor exhibiting a low leakage current using the above semiconductor polymer in composite structure.

In accordance with the feature of the present invention, there is provided an organic semiconductor polymer for thin film transistor comprising a unit having n-type semiconductor properties and a unit having p-type semiconductor properties in the polymer backbone.

In accordance with another feature of the present invention, there is provided a polythienylthiazole derivative represented by Formula 1 below:

(1)

wherein, R$^1$ and R$^4$ are each independently a hydrogen atom, or a C$_{1-9}$ linear, branched or cyclic alkyl group;

R$^2$, R$^3$ and R$^5$ are each independently a hydrogen atom, a C$_{1-12}$ linear or branched alkyl group, —(CH$_2$O)$_n$—R$^6$, —(CH$_2$)$_n$—C(O)OR$^6$, —(CH$_2$)$_n$—OC(O)R$^6$, —(CH$_2$)$_n$—OC(O)OR$^6$, or —(CH$_2$)$_n$—C(O)OCH$_2$OR$^6$ (in which n is an integer of 0 to 6 and R$^6$ is a hydrogen atom, or a C$_{1-12}$ linear, branched or cyclic alkyl group); and l is a real number of 0.01–1.0 and m is a real number of 0.0–0.99, provided that the sum of l and m equals 1.

In accordance with another feature of the present invention, there is provided a method for preparing a polythienylthiazole derivative represented by Formula 1 below:

(1)

wherein, R$^1$ and R$^4$ are each independently a hydrogen atom, or a C$_{1-9}$ linear, branched or cyclic alkyl group;

R$^2$, R$^3$ and R$^5$ are each independently a hydrogen atom, a C$_{1-12}$ linear or branched alkyl group, —(CH$_2$O)$_n$—R$^6$, —(CH$_2$)$_n$—C(O)OR$^6$, —(CH$_2$)$_n$—OC(O)R$^6$, —(CH$_2$)$_n$—OC(O)OR$^6$, or —(CH$_2$)$_n$—C(O)OCH$_2$OR$^6$ (in which n is an integer of 0 to 6 and R$^6$ is a hydrogen atom, or a C$_{1-12}$ linear, branched or cyclic alkyl group); and l is a real number of 0.01–1.0 and m is a real number of 0.0–0.99, provided that the sum of l and m equals 1, by polymerizing a monomer represented by Formula 2 below:

(2)

wherein, $R^1$ to $R^4$ are the same as defined in Formula 1 and X is a halogen atom, selectively mixed with a monomer represented by Formula 3 below:

(3)

wherein, $R^5$ is the same as defined in Formula 1 and X is a halogen atom, under nitrogen atmosphere at 60–80° C. for 48–72 hours in the presence of a catalyst represented by Formula 4 below:

Ni(0)Lm    (4)

wherein, Lm represents at least two ligand compounds selected from the group consisting of cod (1,5-cyclooctadiene), 2,2'-bipyridine and triphenylphosphine.

In accordance with another feature of the present invention, there is provided an organic thin film transistor comprising a gate electrode, a gate insulating layer, an organic active layer and source/drain electrodes, wherein the organic active layer comprises an organic semiconductor polymer comprising a unit having n-type semiconductor properties and a unit having p-type semiconductor properties.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS OF THE INVENTION

Hereinafter, the present invention will be described in more detail.

The organic semiconductor polymer of the present invention has a composite structure in which a unit having n-type semiconductor properties is incorporated with a unit having p-type semiconductor properties.

As the organic semiconductor polymer, a polythienylthiazole derivative having a structure in which thiazole rings are incorporated into the main chain of a polythiophene derivative, is preferred. The polythienylthiazole derivative is represented by Formula 1 below:

(1)

wherein, $R^1$ and $R^4$ are each independently a hydrogen atom, or a $C_{1-9}$ linear, branched or cyclic alkyl group;

$R^2$, $R^3$ and $R^5$ are each independently a hydrogen atom, a $C_{1-12}$ linear or branched alkyl group, $-(CH_2O)_n-R^6$, $-(CH_2)_n-C(O)OR^6$, $-(CH_2)_n-OC(O)R^6$, $-(CH_2)_n-OC(O)OR^6$, or $-(CH_2)_n-C(O)OCH_2OR^6$ (in which n is an integer of 0 to 6 and $R^6$ is a hydrogen atom, or a $C_{1-12}$ linear, branched or cyclic alklyl group); and l is a real number of 0.01–1.0 and m is a real number of 0.0–0.99, provided that the sum of l and m equals 1.

The polythienylthiazole derivative of the present invention can be prepared by homopolymerizing a monomer represented by Formula 2 below:

(2)

wherein, $R^1$ to $R^4$ are the same as defined in Formula 1 and X is a halogen atom, or copolymerizing the monomer of Formula 2 and a monomer represented by Formula 3 below:

(3)

wherein, $R^5$ is the same as defined in Formula 1 and X is a halogen atom.

The tetramer consisting of two thiazole rings and two thiophene rings represented by Formula 2 is synthesized through a multi-step reaction using bithiophene as a starting material, as depicted by Reaction Scheme 1 below:

The reaction is explained below in terms of respective steps.

First, the starting material, bithiophene is halogenated with a reagent such as N-bromosuccinimide (NBS) in a solvent, such as DMF, carbon tetrachloride (CCl$_4$) or acetic acid to synthesize a compound (1) in high yield. The compound (1) is reacted with copper cyanide (CuCN) to prepare a compound (2), which is then halogenated with dithiophosphoric acid O,O'-diethylether and a halogenoalkanone to prepare a compound (4) containing thiazole rings. The compound (4) is further halogenated in the same manner as in the preparation of the compound (1) to prepare a compound (5).

To prepare the polythienylthiazole derivative according to the present invention, a chemical or electrochemical oxidative polymerization or a polycondensation in the presence of an organic transition metal such as nickel or palladium can be used. Both of the methods are representative polymerization process for heteroaromatic compound. In particular, in terms of high regioregularity, it is preferred to carry out a polycondensation in the presence of a nickel(0) compound which is prepared by reacting Ni(cod)$_2$ and a co-ligand, such as 2,2'-bipyridine or triphenylphosphine, in a ratio of 1:1. The nickel(0) compound is a mixed complex compound and represented by Formula 4 below:

wherein, Lm represents at least two ligand compounds selected from the group consisting of cod (1,5-cyclooctadiene), 2,2'-bipyridine and triphenylphosphine.

The polycondensation in the presence of the nickel(0) compound is carried out by Reaction Scheme 2 below:

Specifically, the polycondensation is carried out under nitrogen atmosphere at 60–80° C. for 48–72 hours. At this time, toluene, dimethylformamide (DMF), etc., can be used as a polymerization solvent. The polythienylthiazole derivative thus prepared has a number average molecular weight of 10,000–70,000.

The organic semiconductor polymer of the present invention can be used as a novel organic semiconductor material constituting an active layer, to fabricate OTFT devices. The concrete example of the structure of OTFT include, but not limited to, a substrate/a gate electrode/a gate insulating layer/an organic active layer/source-drain electrodes, and a substrate/a gate electrode/a gate insulating layer/source-drain electrodes/an organic active layer.

The organic semiconductor polymer of the present invention can be formed into a thin film by screen printing, printing, spin-coating, dipping or ink spraying.

The gate insulating layer constituting the OTFT devices can be made of a commonly used insulator having a high dielectric constant. Specific examples of the insulator include, but are not limited to, ferroelectric insulators, such as Ba$_{0.33}$Sr$_{0.66}$TiO$_3$ (BST: barium strontium titanate), Al$_2$O$_3$, Ta$_2$O$_5$, La$_2$O$_5$, Y$_2$O$_3$, TiO$_2$, etc.; inorganic insulators, such as PbZr$_{0.33}$Ti$_{0.66}$O$_3$ (PZT), Bi$_4$Ti$_3$O$_{12}$, BaMgF$_4$, SrBi$_2$(TaNb)$_2$O$_9$, Ba(ZrTi)O$_3$ (BZT), BaTiO$_3$, SrTiO$_3$, Bi$_4$Ti$_3$O$_{12}$, SiO$_2$, SiN$_x$, AlON, etc.; and organic insulators, such as polyimide, BCB (benzocyclobutene), parylene, polyacrylate, polyvinylalcohol, polyvinylphenol, etc.

The gate electrode can be made of a commonly used metal. Specific examples of the metal include gold (Au), silver (Ag), nickel (Ni), indium tin oxide (ITO), aluminum (Al), chromium (Cr), etc., but are not limited thereto.

The source and drain electrodes can be made of a commonly used metal. Specific examples of the metal include gold (Au), silver (Ag), nickel (Ni), indium tin oxide (ITO), chromium (Cr), etc., but are not limited thereto.

The substrate can be made of glass, polyethylenenaphthalate (PEN), polyethyleneterephthalate (PET), polycarbonate, polyvinylalcohol, polyacrylate, polyimide, polynorbornene, polyethersulfone (PES), etc., but are not limited thereto, Hereinafter, the present invention will be explained in more detail with reference to the following examples. However, these examples are given for the purpose of illustration and not of limitation.

PREPARATIVE EXAMPLE 1

Synthesis of 2,5-dibromobithiophene (1)

10 g (60 mmol) of bithiophene were diluted in 300 mL of acetic acid, and then 22 g (0.12 mol) of N-bromosuccinimide (hereinafter, referred to as 'NBS') were slowly added thereto. Solid precipitates were obtained while the reaction proceeded exothermically. After the reaction mixture was reacted at room temperature for 3 hours, it was poured into a sodium carbonate aqueous solution to complete the reaction. After the resulting mixture was extracted with toluene and washed with water, the obtained organic layer was dried over anhydrous magnesium sulfate, filtered and distilled under reduced pressure to prepare the title compound as a gray solid without purification.

$^1$H-NMR (300 MHz, $CDCl_3$) δ (ppm) 6.84 (d, 2H, J=3.8 Hz), 6.95 (d, 2H, J=3.8 Hz)

PREPARATIVE EXAMPLE 2

Synthesis of 2,5-dicyanobithiophene (2)

The compound (1) prepared in Preparative Example 1 and 11.8 g (0.13 mmol) of copper cyanide (CuCN) were added to a reactor containing 150 mL of DMF. The mixture was refluxed for 4 hours. After the reaction was completed, a mixture of ferric chloride ($FeCl_3$), concentrated hydrochloric acid and distilled water (48 g: 12 mL: 72 mL) was added to the reactor and heated at 60–70° C. for 30 minutes to crush the complex compound (RCN-Cu complex). The hot solution was extracted with toluene, and the obtained organic layer was washed with 50% hydrochloric acid. The organic layer was dried over anhydrous magnesium sulfate, filtered, and distilled under reduced pressure to prepare 1.67 g of the title compound as a solid.

$^1$H-NMR (300 MHz, DMSO-$d_6$) δ (ppm) 7.70 (d, 2H, J=4.0 Hz), 8.02 (d, 2H, J=4.0 Hz)

PREPARATIVE EXAMPLE 3

Synthesis of 2,5-dithioamidobithiophene (3)

1.67 g (7.72 mmol) of the compound (2) prepared in Preparative Example 2 and 7.2 mL (38.6 mmol) of dithiophosphoric acid O,O'-diethylether were added to 22 mL of a mixture of THF/distilled water (10:1). The reaction mixture was refluxed for 8 hours. As the temperature increased, more solid precipitates were obtained. The precipitates thus obtained were cooled to room temperature, washed with ethyl acetate and acetone and filtered to prepare 1.84 g of the title compound as an orange solid.

$^1$H-NMR (300 MHz, DMSO-$d_6$) δ (ppm) 7.46 (d, 2H, J=4.1 Hz), 7.65 (d, 2H, J=4.1 Hz), 9.49 (s, 2H), 9.69 (s, 2H)

PREPARATIVE EXAMPLE 4

Synthesis of 2,5-dithiazoylbithiophene (4)

1.84 g (6.47 mmol) of the compound (3) prepared in Preparative Example 3 and 4 g (19.4 mmol) of bromooctanone were added to 12 mL of DMF (0.5M). The reaction mixture was refluxed for 2 hours and washed with water. Then, the obtained organic layer was dried over anhydrous magnesium sulfate, filtered, distilled under reduced pressure, and purified by column chromatography (eleunt: 100% toluene) to prepare 1.6 9 of the title compound as a yellow solid.

$^1$H-NMR (300 MHz, $CDCl_3$) δ (ppm) 0.90 (t, 6H, J=7.0 Hz), 1.25–1.41 (m, 12H), 1.71–1.80 (m, 4H), 2.79 (t, 4H, J=7.7 Hz), 6.81 (s, 2H), 7.17 (d, 2H, J=3.9 Hz), 7.38 (d, 2H, J=3.9 Hz)

PREPARATIVE EXAMPLE 5

Figure 2:
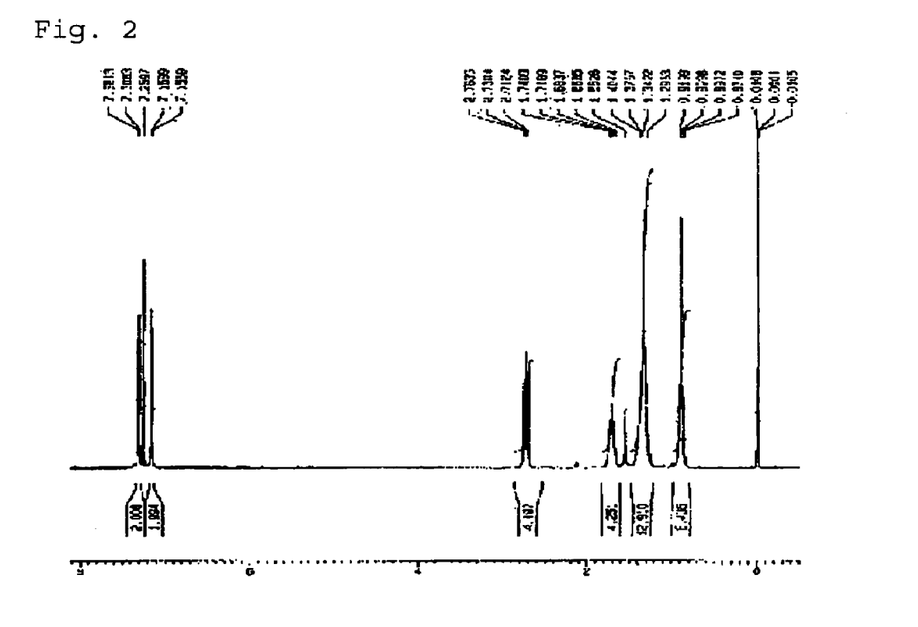
FIG. 2 is a $^1$H-NMR spectrum of a tetramer synthesized in Preparative Example 5 of the present invention.

Synthesis of Monomer (5) ($R^2$, $R^3$=H) Composed of Thiazole and Thiophene Rings 1.6 g (0.6 mmol) of the compound (4) prepared in Preparative Example 4 was diluted in 30 mL of acetic acid, and then 1.2 g (6.71 mmol) of NBS was slowly added thereto. Yellow solid precipitates were obtained while the reaction proceeded exothermically. After the reaction mixture was reacted at room temperature for 3 hours, it was carefully poured into a sodium carbonate aqueous solution to finish the reaction. The resulting product was extracted with ethyl acetate and washed with water. The obtained organic layer was dried over anhydrous magnesium sulfate, filtered, distilled under reduced pressure, and recrystallized to prepare the title compound as a yellow solid. The $^1$H-NMR ($CDCl_3$) of the compound (5) is shown in FIG. 2.

$^1$H-NMR (300 MHz, $CDCl_3$) δ (ppm) 0.90 (t, 6H, J=7.0 Hz), 1.25–1.41 (m, 12H), 1.67–1.80 (m, 4H), 2.74 (t, 4H, J=7.7 Hz), 7.16 (d, 2H, J=3.9 Hz), 7.31 (d, 2H, J=3.9 Hz)

PREPARATIVE EXAMPLE 6

Synthesis of Monomer (5) ($R^2$, $R^3$=n-$C_6H_{13}$) Composed of Thiazole and Thiophene Rings The same processes as in Preparative Examples 1 to 5 were conducted except that the starting material was 3,4-hexylbithiophene.

Figure 3:
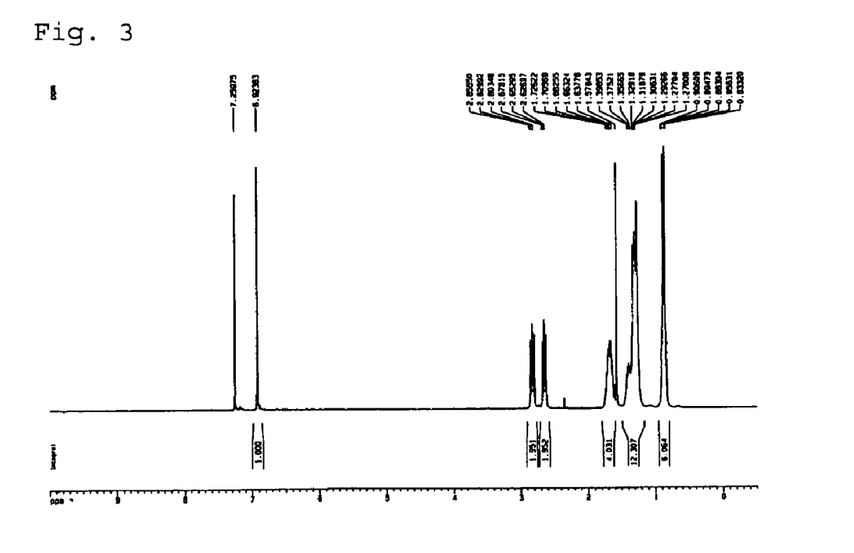
FIG. 3 is a $^1$H-NMR spectrum of a tetramer synthesized in Preparative Example 6 of the present invention.

The $^1$H-NMR ($CDCl_3$) of the compound (5) is shown in FIG. 3.

$^1$H-NMR (300 MHz, $CDCl_3$) δ (ppm) 0.89 (m, 12H), 1.27–1.41 (m, 24H), 1.63–1.73 (m, 8H), 2.65 (t, 4H, J=7.7 Hz), 2.83 (t, 4H, J=7.7 Hz), 6.93 (s, 2H).

PREPARATIVE EXAMPLE 7

Preparation of Polymer 1

Figure 4:
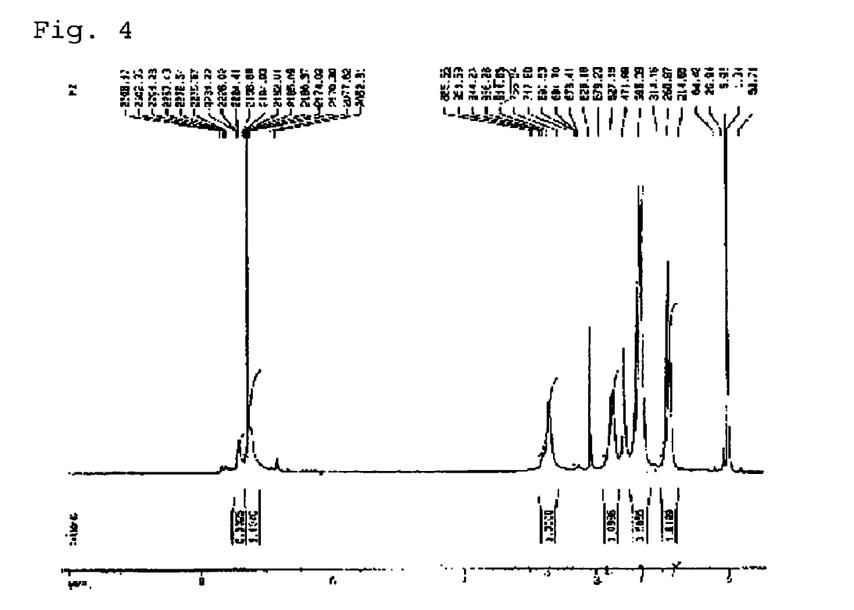
FIG. 4 is a $^1$H-NMR spectrum of a polythienylthiazole derivative prepared in Preparative Example 7 of the present invention.

1.044 g (3.8 mmol) of Ni(cod)$_2$, 0.59 g (3.8 mmol) of bipyridine and 0.45 g of cyclooctadiene were charged into a reactor containing anhydrous DMF (10 mL) under nitrogen atmosphere. The mixture was stirred at 60° C. for 30 minutes. 1.25 g (1.9 mmol) of the monomer (5) ($R^2$, $R^3$=H) prepared in Preparative Example 5 and 40 mL of anhydrous toluene were added to the reactor, and then stirred at about 80° C. for about 48 hours. After the reaction was completed, the reaction solution was cooled to room temperature and then transferred to a mixture of ammonia water/methanol (1/2, ca. 1.2 L). The resulting mixture was stirred for about 12 hours, and then filtered under reduced pressure to obtain a crude product. The crude product was dissolved in toluene, precipitated in methanol several times, dried at 60° C. for 24 hours to prepare 0.25 g of polymer 1 (yield=26%; Mn=20,000). The $^1$H-NMR ($CDCl_3$) of the polymer 1 is shown in FIG. 4.

$^1$H-NMR (300 MHz, $CDCl_3$) δ (ppm) 1.21 (3H, $CH_3$), 1.30 (6H, ($CH_2)_3$), 1.73 (2H, $CH_2$), 2.69 (2H, $CH_2$), 7.24 (2H, thiophene-H), 7.40 (2H, thiophene-H).

PREPARATIVE EXAMPLE 8

Preparation of Polymer 2

Figure 5:
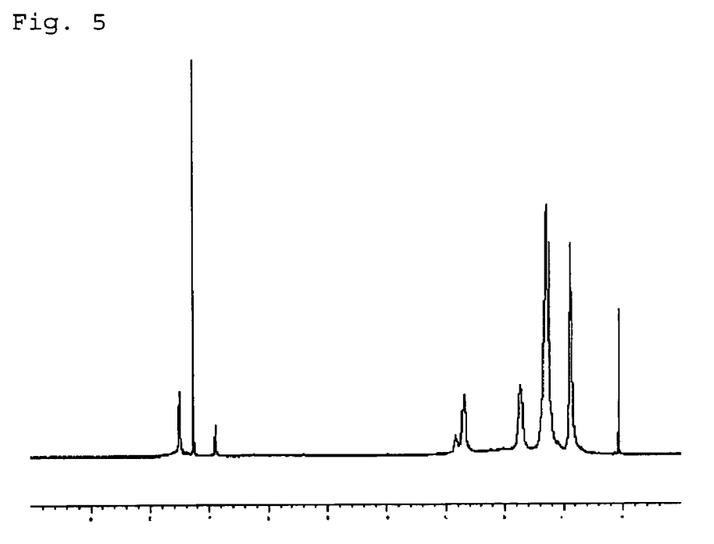
FIG. 5 is a $^1$H-NMR spectrum of a polythienylthiazole derivative prepared in Preparative Example 8 of the present invention.

1.75 g (6.4 mmol) of Ni(cod)$_2$, 1.00 g (6.4 mmol) of bipyridine and 0.76 g of cyclooctadiene were charged into a reactor containing 10 mL of anhydrous DMF under nitrogen atmosphere. The mixture was stirred at 60° C. for 30 minutes. 0.70 g (1.06 mmol) of the monomer (5) (R$^2$, R$^3$=H) prepared in Preparative Example 5, 0.69 g (2.1 mmol) of dibromohexylthiophene and 60 mL of anhydrous toluene were added to the reactor, and then stirred at about 70° C. for about 48 hours. After the reaction was completed, the reaction solution was cooled to room temperature and then transferred to a mixture of ammonia water/methanol (1/2, ca. 1.2 L). The resulting mixture was stirred for about 12 hours, and then filtered under reduced pressure to obtain a crude product. The crude product was dissolved in toluene, precipitated in methanol several times, dried at 60° C. for 24 hours to prepare 0.17 g of polymer 2 (yield=24%; Mn=22,000). The $^1$H-NMR (CDCl$_3$) of the polymer 2 is shown in FIG. 5.

$^1$H-NMR (300 MHz, CDCl$_3$) d (ppm) 0.84–0.88 (br, 6H, —CH$_3$), 1.23–1.27 (br, 12H, —(CH$_2$)$_3$—), 1.71 (s, 4H, —CH$_2$—), 2.80 (br, 4H, thiazole-CH$_2$), 7.50 (s, 2H, thiophene-H).

PREPARATIVE EXAMPLE 9

Preparation of Polymer 3

Figure 6:
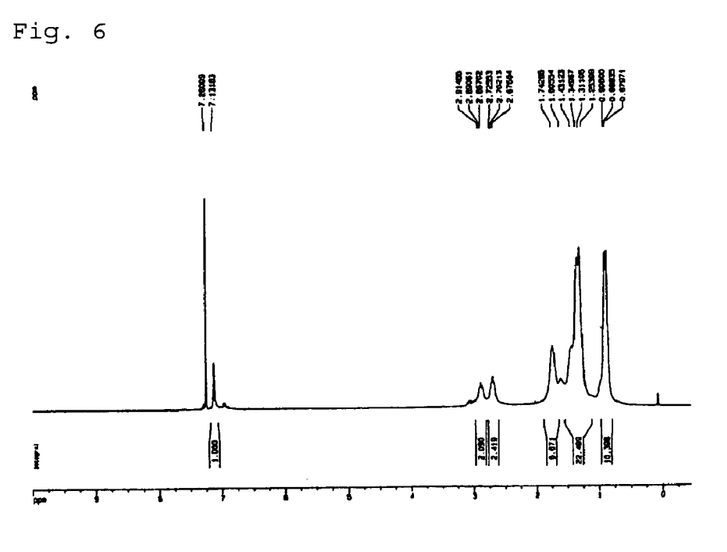
FIG. 6 is a $^1$H-NMR spectrum of a polythienylthiazole derivative prepared in Preparative Example 9 of the present invention.

1.044 g (3.8 mmol) of Ni(cod)$_2$, 0.59 g (3.8 mmol) of bipyridine and 0.45 g of cyclooctadiene were charged into a reactor containing 10 mL of anhydrous DMF under nitrogen atmosphere. The mixture was stirred at 60° C. for 30 minutes. 1.25 g (1.9 mmol) of the monomer (5) (R$^2$, R$^3$=n-C$_6$H$_{13}$) prepared in Preparative Example 6 and 40 ml of anhydrous toluene were added to the reactor, and then stirred at about 80° C. for about 48 hours. After the reaction was completed, the reaction solution was cooled to room temperature and then transferred to a mixture of ammonia water/methanol (1/2, ca. 1.2 L). The resulting mixture was stirred for about 12 hours, and then filtered under reduced pressure to obtain a crude product. The crude product was dissolved in toluene, precipitated in methanol several times, dried at 60° C. for 24 hours to prepare 0.25 g of polymer 3 (yield=26%; Mn=20,000). The $^1$H-NMR (CDCl$_3$) of the polymer 3 is shown in FIG. 6.

$^1$H-NMR (300 MHz, CDCl$_3$) δ (ppm) 0.89 (12H, CH$_3$), 1.31 (24H, (CH$_2$)$_3$), 1.74 (8H, CH$_2$), 2.70 (4H, Thiophene-CH$_2$), 2.89 (4H, Thiazole-CH$_2$), 7.13 (2H, Thiophene-H).

1) Fabrication OTFT Device

EXAMPLE

Figure 1:
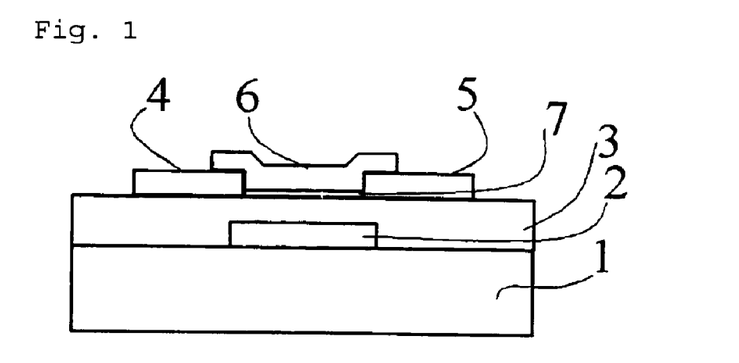
FIG. 1 is a cross-sectional view showing the structure of a device fabricated in an Example of the present invention.

First, chromium as a gate electrode was deposited onto a previously washed glass substrate to a thickness of 1000 Å by a sputtering process, and then SiO$_2$ as a gate insulating layer was deposited onto the gate electrode to a thickness of 1000 Å by a CVD process. ITO as source-drain electrodes was deposited onto the gate insulating layer to a thickness of 1200 Å by a sputtering process. The resulting structure was washed with isopropyl alcohol for 10 minutes, and dried. Then, it was dipped in a 10 mM octadecyltrichlorosilane solution in chloroform, for 30 seconds, washed with acetone, and dried. Separately, the polymers 1 to 3 prepared in Preparative Examples 7 to 9 were dissolved in chloroform in a concentration of 1 wt %, respectively. Each solution was applied onto the resulting structure at 1000 rpm to a thickness of 1000 Å, baked under argon atmosphere at 100° C. for 1 hour to fabricate OTFT devices shown in FIG. 1.

COMPARATIVE EXAMPLE

An OTFT device was fabricated in the same manner as in Example above, except that polyhexylthiophene commercially available from Aldrich was used as an organic semiconductor material.

2) Evaluation of Electrical Properties of OTFT Devices

Figure 7:
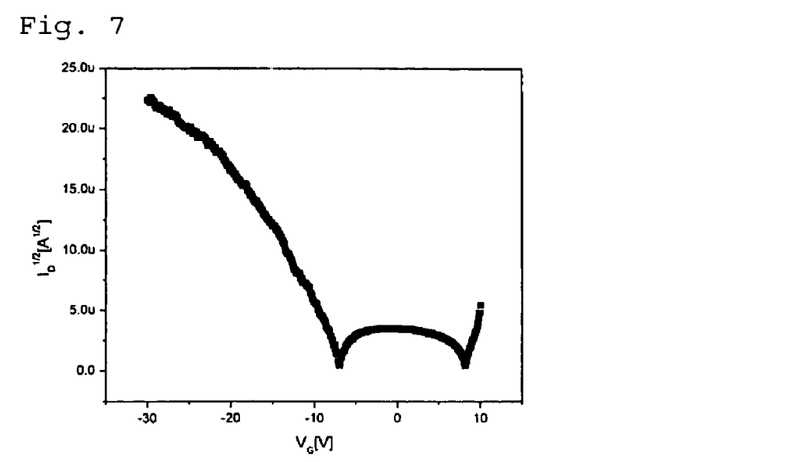
FIG. 7 is a current-transfer curve (p-type) of a device fabricated from a polythienylthiazole derivative prepared in Preparative Example 7 of the present invention.
Figure 8:
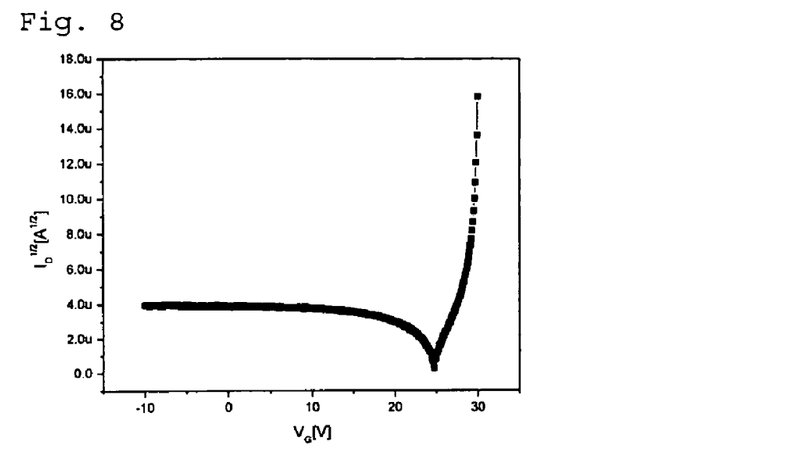
FIG. 8 is a current-transfer curve (n-type) of a device fabricated from a polythienylthiazole derivative prepared in Preparative Example 7 of the present invention.
Figure 9:
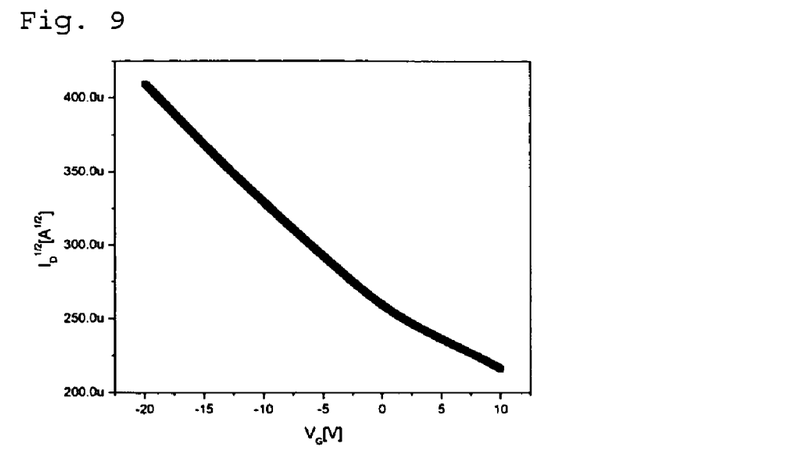
FIG. 9 is a current-transfer curve of a device fabricated from polyhexylthiophene.

Charge mobility of the devices fabricated in Example and Comparative Example was calculated from current-transfer curves of the devices, plotted using a Semiconductor Characterization System (4200-SCS, KEITHLEY Corp.). FIGS. 7 and 8 shows respectively p-type and n-type current-transfer curves measured from the device using polymer 1. FIG. 9 shows a current-transfer curve measured from the device using polyhexylthiophene The charge mobility of the devices was calculated by the following current equation at the saturation region:

$$I_{SD} = \frac{WC_0}{2L}\mu(V_G - V_T)^2$$

After transferring the equation to another showing the relationship between $(I_{SD})^{1/2}$ and $V_G$, the charge mobility was finally calculated from the slope through the following equation:

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

* $I_{SD}$: Source-drain current, $\mu_{FET}$: charge mobility, $C_o$: capacitance of the insulating layer, W: channel width, L: channel length, $V_G$: gate voltage, $V_T$: threshold voltage.

Off-state leakage current was determined by measuring a current flowing at off-state.

TABLE 1

| Organic active layer | Charge mobility (cm$^2$/Vs) | $I_{on}/I_{off}$ | Off-state leakage current (A) | Example Nos. |
|---|---|---|---|---|
| Polymer 1 | 0.00002 | 1000 | 10$^{-12}$ | Preparative Example 7 |
| Polymer 2 | 0.0001 | 1000 | 10$^{-11}$ | Preparative Example 8 |
| Polymer 3 | 0.001 | 1000 | 10$^{-11}$ | Preparative Example 9 |
| Polyhexyl-thiophene | 0.0008 | 100–400 | 10$^{-8}$ | Comparative Example |

As can be seen from Table 1, the polythienylthiazole derivative in which thiazole rings having a high electron affinity are incorporated into a polythiophene derivative represents considerably reduced off-state leakage current. $I_{on}/I_{off}$ ratio was also increased about 1 order.

In FIGS. 7 and 8 showing the current-transfer properties, the OTFT devices fabricated in Examples above showed OTFT properties, i.e. activities at both positive and negative gate voltages. These graphs reveal that the polythienylthiazole derivative of the present invention has p- and n-type composite structure, which was not observable in conventional high molecule semiconductor materials for OTFT.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic semiconductor polymer for a thin film transistor comprising a unit having n-type semiconductor properties and a unit having p-type semiconductor properties in a polymer backbone,
wherein the organic semiconductor polymer is a polythienylthiazole derivative represented by Formula 1 below:

(1)

wherein, $R^1$ and $R^4$ are each independently a hydrogen atom, or a $C_{1-9}$ linear, branched or cyclic alkyl group;
$R^2$, $R^3$ and $R^5$ are each independently a hydrogen atom, a $C_{1-12}$ linear or branched alkyl group, $-(CH_2O)_n-R^6$, $-(CH_2)_n-C(O)OR^6$, $-(CH_2)_n-OC(O)R^6$, $-(CH_2)_n-OC(O)OR^6$, or $-(CH_2)_n-C(O)OCH_2OR^6$, in which n is an integer of 0 to 6 and $R^6$ is a hydrogen or a $C_{1-12}$ linear, branched or cyclic alkyl group); and
l is a real number of 0.01–1.0 and m is a real number of 0.99–0.0, provided that the sum of l and m equals 1.

2. A method for preparing a polythienylthiazole derivative represented by Formula 1 below:

(1)

wherein $R^1$ and $R^4$ are each independently a hydrogen atom, or a $C_{1-9}$ linear, branched or cyclic alkyl group;
$R^2$, $R^3$ and $R^5$ are each independently a hydrogen atom, a $C_{1-12}$ linear or branched alkyl group, $-(CH_2O)_n-R^6$, $-(CH_2)_n-C(O)OR^6$, $-(CH_2)_n-OC(O)R^6$, $-(CH_2)_n-OC(O)OR^6$, or $-(CH_2)_n-C(O)OCH_2OR^6$, in which n is an integer of 0 to 6 and $R^6$ is hydrogen, or a $C_{1-12}$ linear, branched or cyclic alkyl group; and
l is a real number of 0.01–1.0 and m is a real number of 0.99–0.0, provided that the sum of l and m equals 1,
the method comprising polymerizing a monomer represented by Formula 2 below:

(2)

wherein, $R^1$ to $R^4$ are the same as defined in Formula 1 and X is a halogen atom, selectively mixed with a monomer represented by Formula 3 below:

(3)

wherein, $R^5$ is the same as defined in Formula 1 and X is a halogen atom, under nitrogen atmosphere at 60–80° C. for 48–72 hours in the presence of a catalyst represented by Formula 4 below:

Ni(0)Lm     (4)

wherein, Lm represents at least two ligand compounds selected from the group consisting of cod (1,5-cyclooctadiene), 2,2'-bipyridine and triphenylphosphine.

3. An organic thin film transistor comprising a gate electrode, a gate insulating layer, an organic active layer and source/drain electrodes, wherein the organic active layer comprises an organic semiconductor polymer comprising a unit representing n-type semiconductor properties and a unit representing p-type semiconductor properties,
wherein the organic semiconductor polymer is a polythienylthiazole derivative represented by Formula 1:

(1)

wherein, $R^1$ and $R^4$ are each independently a hydrogen atom, or a $C_{1-9}$ linear, branched or cyclic alkyl group;
$R^2$, $R^3$ and $R^5$ are each independently a hydrogen atom, a $C_{1-12}$ linear or branched alkyl group, $-(CH_2O)_n-R^6$, $-(CH_2)_n-C(O)OR^6$, $-(CH_2)_n-OC(O)R^6$, $-(CH_2)_n-OC(O)OR^6$, or $-(CH^2)_n-C(O)OCH_2OR^6$ (in which n is an integer of 0 to 6 and $R^6$ is a hydrogen, or a $C_{1-12}$ linear, branched or cyclic alkyl group); and
l is a real number of 0.01–1.0 and m is a real number of 0.99–0.0, provided that the sum of l and m equals 1.

4. The organic thin film transistor according to claim 3, wherein the organic active layer is formed into a thin film by screen printing, printing, spin-coating, dipping or ink spraying.

5. The organic thin film transistor according to claim 3, wherein the insulating layer is made of a material selected from ferroelectric insulators including $Ba_{0.33}Sr_{0.66}TiO_3$ (BST: barium strontium titanate), $Al_2O_3$, $Ta_2O_5$, $La_2O_5$, $Y_2O_3$ and $TiO_2$; inorganic insulators including $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON; and organic insulators including polyimide, BCB (benzocyclobutene), parylene, polyacrylate, polyvinylalcohol and polyvinylphenol.

6. The organic thin film transistor according to claim 3, wherein the substrate is made of a material selected from the group consisting of glass, polyethylenenaphthalate (PEN), polyethyleneterephthalate (PET), polycarbonate, polyvinylalcohol, polyacrylate, polyimide, polynorbornene and polyethersulfone (PES).

7. The organic thin film transistor according to claim 3, wherein the gate electrode is made of a material selected from the group consisting of gold (Au), silver (Ag), nickel (Ni), aluminum (Al), indium tin oxide (ITO) and chromium (Cr), and the source and drain electrodes are made of a material selected from the group consisting of gold (Au), silver (Ag), nickel (Ni), indium tin oxide (ITO) and chromium (Cr).

* * * * *